(12) United States Patent
Das et al.

(10) Patent No.: US 8,737,438 B2
(45) Date of Patent: May 27, 2014

(54) SYSTEMS AND METHODS FOR IMPLEMENTING AN INTERACTION BETWEEN A LASER SHAPED AS LINE BEAM AND A FILM DEPOSITED ON A SUBSTRATE

(75) Inventors: Palash P. Das, Oceanside, CA (US); Thomas Hofmann, San Diego, CA (US); Jesse D. Davis, Coronado, CA (US); Richard L. Sandstrom, Encinitas, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 13/571,129

(22) Filed: Aug. 9, 2012

(65) Prior Publication Data

US 2012/0298838 A1 Nov. 29, 2012

Related U.S. Application Data

(60) Division of application No. 12/386,771, filed on Apr. 21, 2009, now Pat. No. 8,265,109, which is a continuation of application No. 11/138,001, filed on May 26, 2005, now abandoned, which is a continuation-in-part of application No. 10/712,545, filed on Nov. 13, 2003, now Pat. No. 6,928,093, which is a continuation-in-part of application No. 10/141,216, filed on May 7, 2002, now Pat. No. 6,693,939, said application No. 11/138,001 is a continuation-in-part of application No. 10/781,251, filed on Feb. 18, 2004, now Pat. No. 7,167,499, which is a continuation-in-part of application No. 10/425,361, filed on Apr. 29, 2003, now Pat. No. 7,230,964.

(51) Int. Cl.
  *H01S 3/10* (2006.01)
(52) U.S. Cl.
  USPC .......................................................... 372/25
(58) Field of Classification Search
  CPC ..... B23K 26/04; B23K 26/0738; C30B 1/023
  USPC ............................................... 372/55, 57, 64
  See application file for complete search history.

(56) References Cited

U.S. PATENT DOCUMENTS

2003/0043876 A1* 3/2003 Lublin et al. .................... 372/55

* cited by examiner

*Primary Examiner* — Jessica Stultz
*Assistant Examiner* — Tuan Nguyen
(74) *Attorney, Agent, or Firm* — Procopio, Cory, Hargreaves & Savitch LLP; Noel C. Gillespie

(57) ABSTRACT

A laser crystallization apparatus and method are disclosed for selectively melting a film such as amorphous silicon that is deposited on a substrate. The apparatus may comprise an optical system for producing stretched laser pulses for use in melting the film. In still another aspect of an embodiment of the present invention, a system and method are provided for stretching a laser pulse. In another aspect, a system is provided for maintaining a divergence of a pulsed laser beam (stretched or non-stretched) at a location along a beam path within a predetermined range. In another aspect, a system may be provided for maintaining the energy density at a film within a predetermined range during an interaction of the film with a shaped line beam.

20 Claims, 13 Drawing Sheets

SYSTEMS AND METHODS FOR IMPLEMENTING AN INTERACTION BETWEEN A LASER SHAPED AS LINE BEAM AND A FILM DEPOSITED ON A SUBSTRATE

CROSS-REFERENCE TO RELATED APPLICATIONS

The present application is a divisional application of U.S. application Ser. No. 12/386,771, filed on Apr. 21, 2009, entitled "SYSTEMS AND METHODS FOR IMPLEMENTING AN INTERACTION BETWEEN A LASER SHAPED AS A LINE BEAM AND A FILM DEPOSITED ON A SUBSTRATE," which is a continuation of U.S. application Ser. No. 11/138,001, filed on May 26, 2005, entitled "SYSTEMS AND METHODS FOR IMPLEMENTING AN INTERACTION BETWEEN A LASER SHAPED AS A LINE BEAM AND A FILM DEPOSITED ON A SUBSTRATE, which is a continuation-in-part of U.S. application Ser. No. 10/712,545, filed on Nov. 13, 2003 and titled, "LONG DELAY AND HIGH TIS PULSE STRETCHER" which is a continuation-in-part of U.S. application Ser. No. 10/141,216, filed on May 7, 2002, now U.S. Pat. No. 6,693,939, and titled, "LASER LITHOGRAPHY LIGHT SOURCE WITH BEAM DELIVERY," the disclosures of each of which are hereby incorporated by reference herein.

Also, U.S. application Ser. No. 11/138,001, of which U.S. application Ser. No. 12/386,771 is a continuation application, is also a continuation-in-part of U.S. application Ser. No. 10/781,251, titled "VERY HIGH ENERGY, HIGH STABILITY GAS DISCHARGE LASER SURFACE TREATMENT SYSTEM," filed on Feb. 18, 2004.

Also, U.S. application Ser. No. 11/138,001, of which U.S. application Ser. No. 12/386,771 is a continuation application is also a continuation-in-part of U.S. application Ser. No. 10/425,361, filed on Apr. 29, 2003 and titled, "LITHOGRAPHY LASER WITH BEAM DELIVERY AND BEAM POINTING CONTROL."

FIELD OF THE INVENTION

The present invention relates to systems and methods for positioning a film for interaction with a laser shaped as a line beam and for controlling parameters of the shaped line beam, for example, to melt an amorphous silicon film, for example, to crystallize the film for the purpose of manufacturing thin film transistors (TFT's).

BACKGROUND OF THE INVENTION

Laser crystallization of an amorphous silicon film that has been deposited on a substrate, e.g., glass, represents a promising technology for the production of material films having relatively high electron mobilities. Once crystallized, this material can then be used to manufacture thin film transistors (TFT's) and in one particular application, TFT's suitable for use in relatively large liquid crystal displays (LCD's). Other applications for crystallized silicon films may include Organic LED (OLED) and System on a Panel (SOP). In more quantitative terms, high volume production systems may be commercially available in the near future capable of quickly crystallizing a film having a thickness of about 90 nm and a width of about 700 mm or longer. This process may be performed using a pulsed laser that is optically shaped to a line beam, e.g., a laser that is focused in a first axis, e.g., the short axis, and expanded in a second axis, e.g., the long axis. Typically, the first and second axes are mutually orthogonal and both axes are substantially orthogonal to a central ray traveling toward the film. An exemplary line beam for laser crystallization may have a beam width of less than about 20 microns and a beam length of about 700 mm. With this arrangement, the film can be scanned or stepped in a direction parallel to the beam width to sequentially melt and crystallize a film having a substantial length, e.g., 700 mm or more.

In some cases, it may be desirable to ensure that each portion of the silicon film is exposed to a laser energy density that is controlled within a preselected energy density range during melting. In particular, energy density control within a preselected range is typically desired for locations along the shaped line beam, and a somewhat constant energy density is desirable as the line beam is scanned relative to the silicon film. High energy density levels may cause the film to flow resulting in undesirable "thin spots", a non-flat surface profile and poor grain quality. This uneven distribution of film material is often termed "agglomeration" and can render the crystallized film unsuitable for certain applications. On the other hand, low energy density levels may lead to incomplete melting and result in poor grain quality. By controlling energy density, a film having substantially homogeneous properties may be achieved.

One factor that can affect the energy density within an exposed film is the spatial relationship of the thin film relative to the pulsed laser's depth of focus (DOF). This DOF depends on the focusing lens, but for a typical lens system configured to produce a line beam having a 20 micron beam width, a good approximation of DOF may be about 20 microns.

With the above in mind, it is to be appreciated that a portion of the silicon film that is completely within the laser's DOF will experience a different energy density than a portion of the silicon film that is only partially within the laser's DOF. Thus, surface variations of the silicon film, the glass substrate and the vacuum chuck surface which holds the glass substrate, even variations as small as a few microns, if unaccounted for, can lead to unwanted variations in energy density from one film location to another. Moreover, even under controlled manufacturing conditions, total surface variations (i.e., vacuum chuck+glass substrate+film) can be about 35 microns. It is to be appreciated that these surface variations can be especially problematic for focused thin beam having a DOF of only about 20 microns.

In addition to surface variations, unwanted movements of the film relative to the shaped line beam can also lead to variations in energy density. For example, small movements can occur during stage vibrations. Also, an improper alignment of the stage relative to the shaped line beam and/or an improper alignment of the stage relative to the scan plane can result in an unwanted energy density variation.

Other factors that can lead to a variation in energy density from one film location to another can include changes in laser output characteristics during a scan (e.g., changes in pulse energy, beam pointing, beam divergence, wavelength, bandwidth, pulse duration, etc). Additionally, the location and stability of the shaped line beam and the quality of the beam focus (e.g., shape) during a scan can affect energy density uniformity.

With the above in mind, Applicants disclose several systems and methods for implementing an interaction between a shaped line beam and a film deposited on a substrate.

SUMMARY OF THE INVENTION

Systems and methods are disclosed for producing pulses having pulse characteristics suitable for an interaction with a film deposited substrate as a shaped beam defines a short axis and a long axis. In one aspect of an embodiment of the present invention, a system and method are provided for stretching a laser pulse. The system may comprise a beam splitter for directing a first portion of the pulse along a first beam path and a second portion of the pulse along a second delaying beam path; and a plurality of reflective elements positioned along the delaying beam path and arranged to invert the second beam portion and cooperate with the beam splitter to place at least a portion of the inverted second beam portion for travel on the first beam path.

In another aspect of an embodiment of the present invention, a system and method are provided for maintaining a divergence of a pulsed laser beam at a location along a beam path within a predetermined range. This system may comprise an adjustable beam expander; an instrument for measuring divergence and generating a signal indicative thereof; and a controller responsive to the signal to adjust the beam expander and maintain the divergence of the pulsed laser beam within the predetermined range.

In yet another aspect of an embodiment of the present invention, a laser crystallization apparatus and method are provided for selectively melting a film disposed on a substrate. The apparatus may comprise a laser source producing a pulsed laser output beam; an optical system stretching pulses in the laser output beam to produce a pulse stretcher output; and an optical arrangement producing a line beam from the pulse stretcher output.

In still another aspect of an embodiment of the present invention, a system and method are provided for maintaining the energy density at a film within a predetermined range during an interaction of the film with a shaped beam. This system may comprise an autofocus sensor for measuring a distance between the film and a focusing lens; and a controller using the measurement to adjust a light source parameter to maintain the energy density at the film with the predetermined range.

DETAILED DESCRIPTION OF PREFERRED EMBODIMENTS

Figure 1:
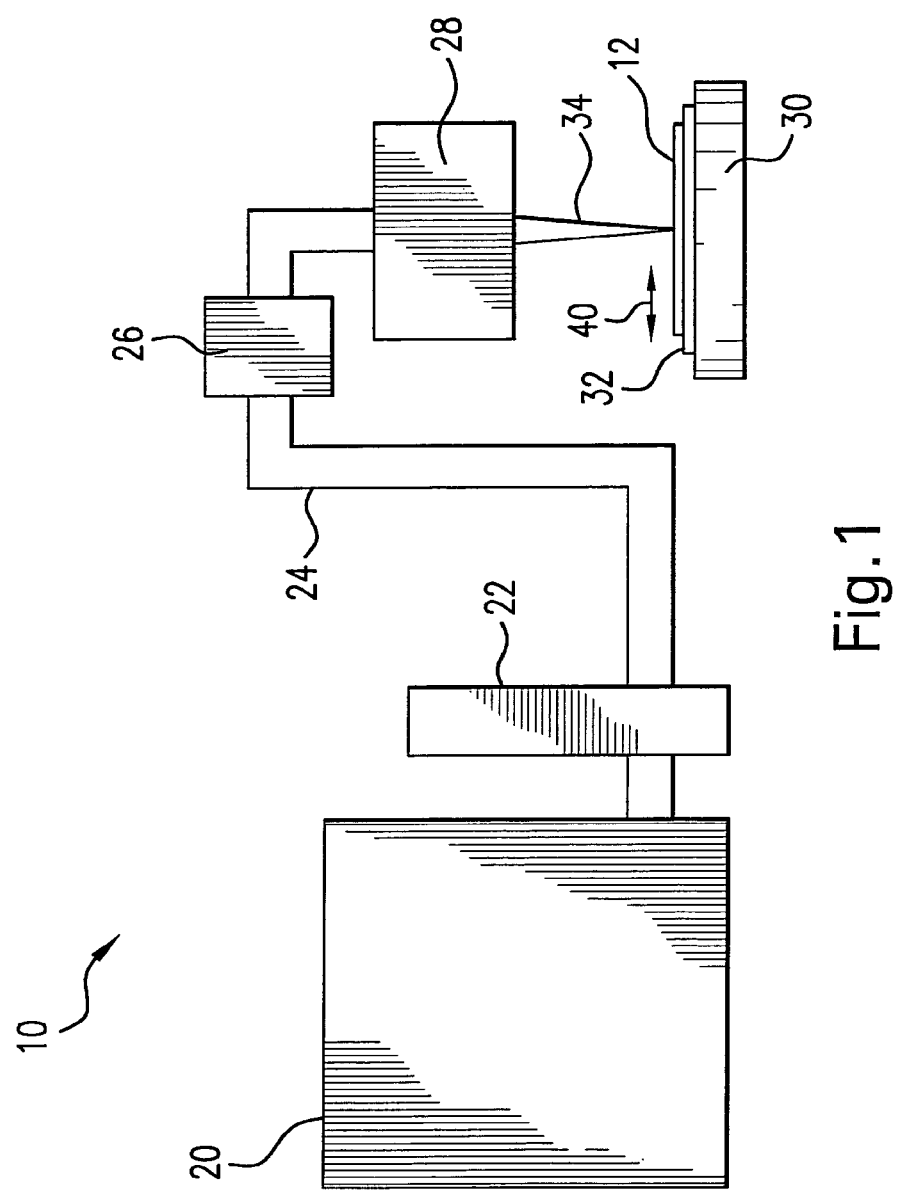
FIG. 1 shows a schematic view of the primary components of an exemplary production system for crystallizing an amorphous silicon film.

Referring initially to FIG. 1, there is shown a schematic, not to scale, view of the primary components of an exemplary production system, designated generally system 10, for crystallizing an amorphous silicon film 12. As shown, the system 10 may include a laser source 20 for generating a pulsed laser beam, a pulse stretcher 22 for increasing pulse duration and a beam delivery unit 24 which may have a mechanism to actively steer the beam and/or an active beam expander. The system 10 may further include a stabilization metrology module 26 for measuring one or more beam characteristics, e.g., wavefront and/or beam pointing, and generating control signals for use by the active steering unit and/or the active beam expander. System 10 may also include an optics module 28 for beam homogenization, beam shaping and/or beam focusing, and a moveable stage system 30 for holding and positioning a silicon film 12 that has been deposited on a substrate 32, which can be for example, glass.

In overview, the system 10 shown in FIG. 1 and described in greater detail below can be configured to generate a focused thin beam 34, e.g. line beam, having a width at the film 12 of about 20 microns or less (short axis) and a length of 700 mm or more (long axis) and a depth of focus (DOF) of about 10-20 microns. Each pulse of the focused thin beam can be used to melt a strip of amorphous silicon.

Thereafter, the strip crystallizes. In particular, the strip crystallizes in a lateral growth process wherein grains grow in a direction parallel to the short axis. Grains grow inward from the edges (parallel to the short axis) and meet creating a ridge (a so-called grain boundary protrusion) along the center of the strip which extends out of the plane of the silicon film. The stage is then moved, either incrementally or continuously, to expose a second strip that is parallel to and overlaps a portion of the first strip. During exposure, the second strip melts and subsequently re-crystallizes. An overlap sufficient to re-melt the ridge may be used. By re-melting the ridge, a flat film surface (e.g., peak-to-peak value of ~15 nm) may be maintained. This process, which is hereinafter referred to as thin-beam, sequential lateral solidification (tb-SLS) is typically repeated until the entire film is crystallized.

Figure 2:
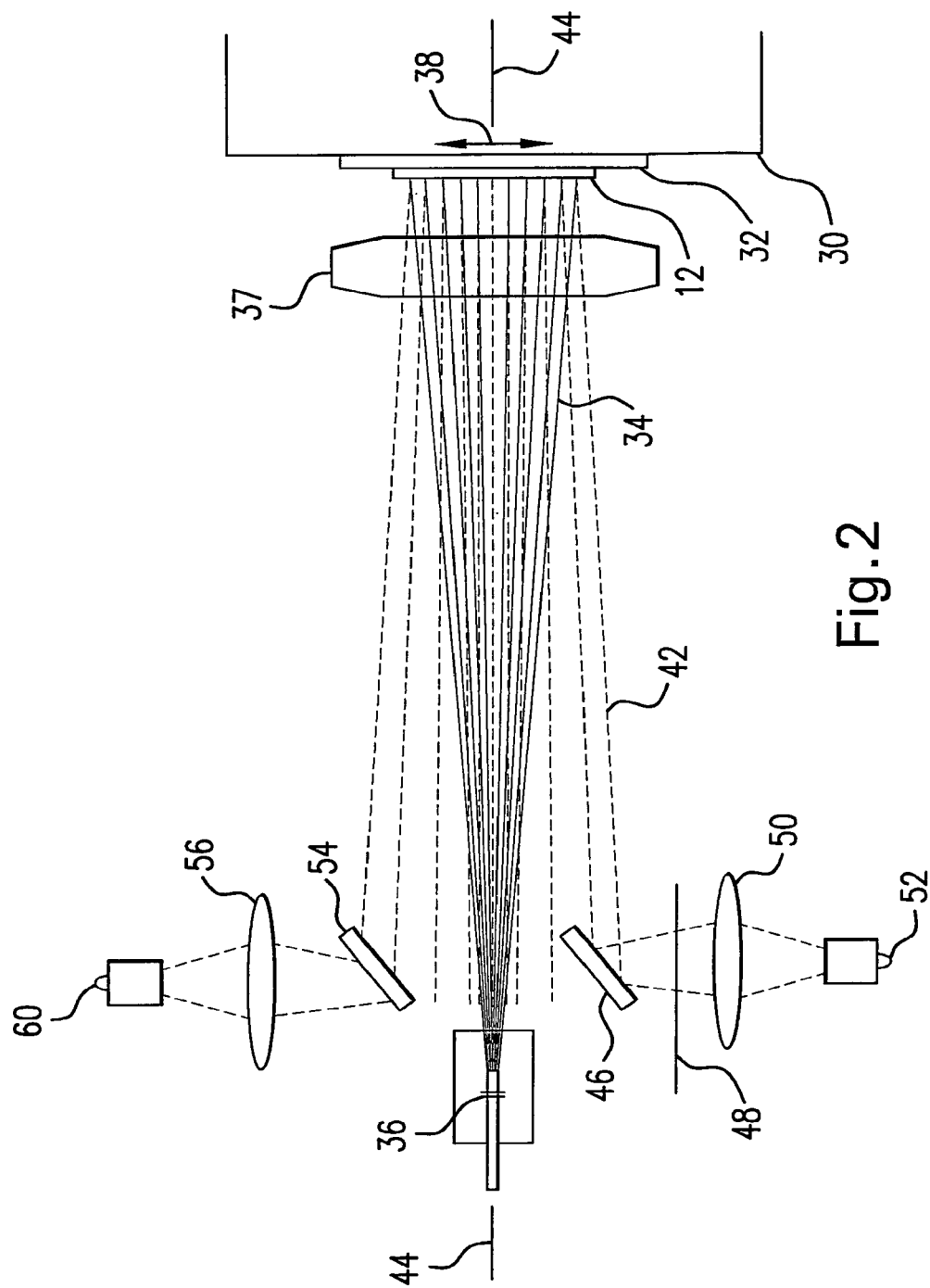
FIG. 2 shows an apparatus for determining whether a line beam is focused at a film deposited on a substrate.
Figure 3A:
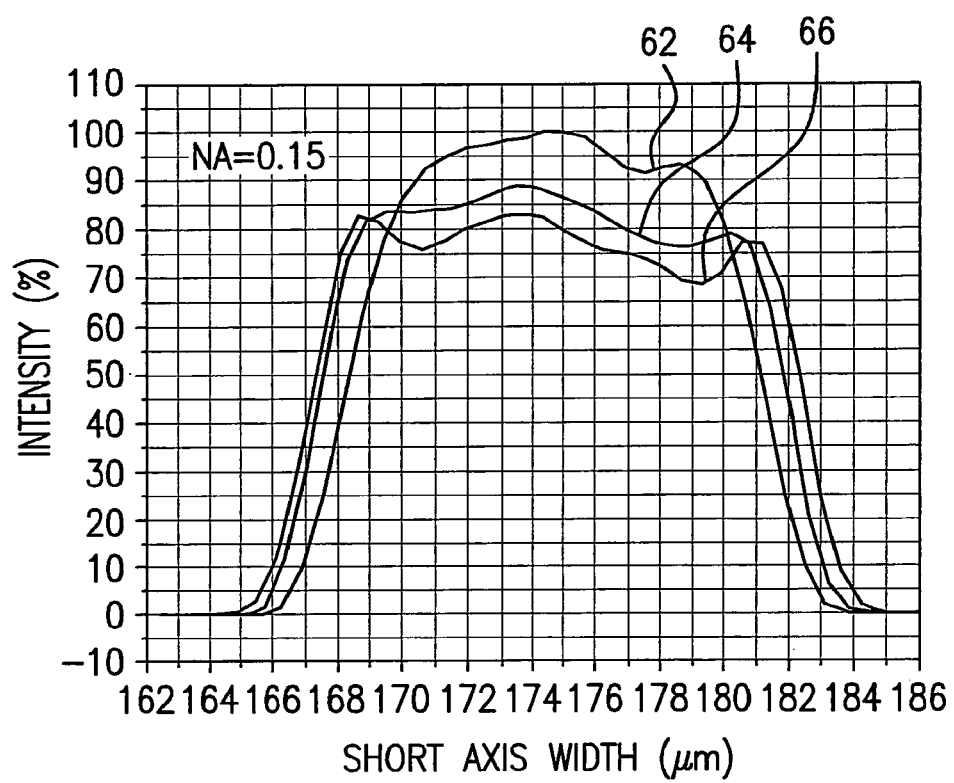
FIG. 3A shows a graphical representation showing intensity variation as a function of short axis beam width for three exemplary beams: a first beam having a best focus in the sampled plane, a second beam having a best focus ten microns from the sample plane and a third beam having a best focus that is fifteen microns from the sampled plane.

FIG. 2 shows an apparatus for determining whether a thin beam pulsed laser 34 is properly focused at a silicon film 12 deposited on a substrate 32. Portions of the optics module 28 (see FIG. 1) may include a short axis field stop 36 and a short axis focusing optic 37. Typically, the beam is initially focused at the field stop 36 and then imaged to produce an intensity profile as shown in FIG. 3A (plot 62) at the film 12. FIG. 3A shows a profile (plot 62) for a field stop 36 constructed as a slit having a small dimension in the short axis. This arrangement may be used to produce the profile shown in FIG. 3A which has a beam width (FWHM) of about 13 gm, an intensity uniformity better than 5% along the flat top of the profile, and steep edge slopes that may be less than about 3 um between the 10% and 90% of full intensity. Beams having a width between about 5 and 10 um may also be used. A single-edge (i.e., knife-blade) may be used in place of the slit at the field stop to produce a beam profile having a steep trailing edge slope (i.e., the edge corresponding to the material that will not be re-melted during the tb-SLS process) while leaving the leading edge unaffected. Although shown as a single lens, it is to be appreciated that the focusing optic 37 may include a number of optical components including, but not limited to various types of lenses.

FIG. 2 shows that the beam 36 is non-collimated and diverges from the field stop 36 to the film 12 in the long axis 38. As indicated above, the length of the beam 36 in the long axis 38 may be about 700 mm or longer. On the other hand, as illustrated in FIG. 1, the beam 36 is focused in the short axis 40 by the optics module 28 which may include the focusing optic 38. With this structural arrangement, light 42 that has reflected from the film 12 continues to diverge from the optical axis 44 and can be analyzed by a detecting system to determine whether the beam 36 is adequately focused in the short axis 40 (shown in FIG. 1).

Continuing with reference to FIG. 2, the detecting system may include a full reflection mirror 46 which directs reflected light 42 to an image plane 48. A magnifying lens 50 is positioned to provide a magnified image of the image plane 48 at the camera 52. For the detecting system, the image plane 48 is positioned such that the distance traveled by reflected light 42 from the film 12 to the image plane 48 is approximately equal (e.g. equal within acceptable tolerances for the pertinent art) to the distance the same light had traveled from the short axis field stop 36 to the film. A camera output can then be used to adjust one or more system variables to improve the focus at film 12 or, as discussed in more detail below, alter the energy density at the film 12. For example, the stage 30 can be moved relative to the focusing optic 37 to adjust the focus.

In some cases, as shown in FIG. 2, it may be desirable to include a second detection system, similar to the one described above, having a mirror 54, magnifying lens 56 and camera 58. In combination, the two detecting systems can be used to simultaneously determine whether light is focused (in the short axis) at both ends of the beam in the long axis 44. One noteworthy functional aspect for the detecting systems shown in FIG. 2, is that the detecting systems, and in particular the mirrors 46, 54, are positioned such that they do not interfere with light traveling from the short axis field stop 36 to the substrate 12. Moreover, this arrangement allows the focus of the thin beam to be analyzed and adjusted during an exposure of the film 12.

FIG. 3A shows a graphical representation showing intensity variation as a function of short axis beam width for a focused beam (plot 62), a beam that is ten microns out-of-focus (plot 64) and a beam that is fifteen microns out-of-focus (plot 66). Note; the plots shown are for a focusing lens having a numerical aperture (NA) of approximately 0.15. An interesting feature of these plots is that all of the plots 62, 64, 66 have relatively steep sidewalls. These steep sidewalls are a result of the optical arrangement shown in FIG. 2 in which a short-axis field stop 36 is used. As such, FIG. 3A shows that the variation in beam intensity as a beam goes out of focus is more pronounced than the corresponding change in beam width. As indicated earlier in the Background Section of this document, it may be desirable to maintain energy density within a pre-selected range at the film 12. More specifically, energy density control at the film 12 may be achieved over a range of focus conditions by varying characteristics of the laser pulse, e.g., pulse energy, with only a small change in beam width.

With the above in mind, Applicants disclose a system and method for maintaining energy density within a preselected range at the film 12, e.g., by altering a pulse characteristic to compensate for a change in focal condition. This change in focal condition can occur, for example, during a scan movement of the stage 30 relative to the laser beam. In greater detail, an energy density obtained with a slightly out-of focus beam (e.g., plot 66) may be chosen as the target energy density. With this target, a focal condition is measured, for example, using the detecting system shown in FIG. 2. It is to be appreciated that alternate methods to determine the focal condition can be used to include autofocus sensors (active or passive) or other suitable techniques capable of measuring a distance between the film 12 and the focusing optic 37 (see FIG. 2). Once the focal condition has been measured, a pulse characteristic such as pulse energy may be altered to reach the targeted energy density. Thus, if the measurement indicates that an out-of-focus condition exists, a first pulse energy, $E_1$, corresponding to the target energy density for the out-of-focus condition is used. On the other hand, when the measurement indicates that the film 12 is within the DOF, a second pulse energy, $E_2$, corresponding to the target energy density for the focus condition is used, with $E_1 < E_2$.

Figure 3B:
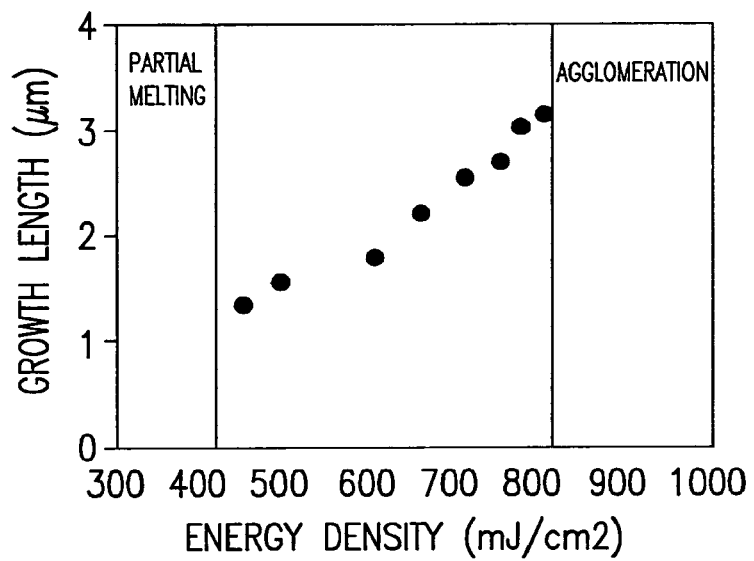
FIG. 3B shows a graphical representation showing energy density as a function of lateral growth length and indicates regions where partial melting and agglomeration may occur.

FIG. 3B shows a graphical representation showing energy density as a function of lateral growth length for a 50 nm thick Si film and indicates regions where partial melting and agglomeration may occur. FIG. 3 also shows that the energy range for the lateral growth may be quite wide (approx. 450 $mJ/cm^2$ and 820 $mJ/cm^2$) with the lateral growth length increasing proportionally with energy density. Larger lateral growth length, in turn, may be beneficial by allowing a larger scan pitch (and higher throughput) while still re-melting the center ridge.

Several methods can be used to adjust the pulse energy, as desired, and in some cases on a pulse-to-pulse basis. For example, for an Excimer laser source, the discharge voltage can be varied to achieve a pre-selected pulse energy. Alternatively, an adjustable attenuator can be positioned along the laser beam's beam path to selectively alter pulse energy. For this purpose, any device known in the art for reducing pulse energy including, but not limited to, filters and pulse trimmers may be used. Other pulse characteristics that can be altered to compensate for focus condition to maintain energy density within a preselected range at different locations at the film 12 may include, but are not necessarily limited to, pulse spectrum (i.e., wavelength) using for example an adjustable line narrowing module or a line selection module. Alternatively, an adaptive optic capable of fast focus control can be used as the focusing optic 37 responsive to a measured focal condition in a controlled feedback loop.

Figure 4:
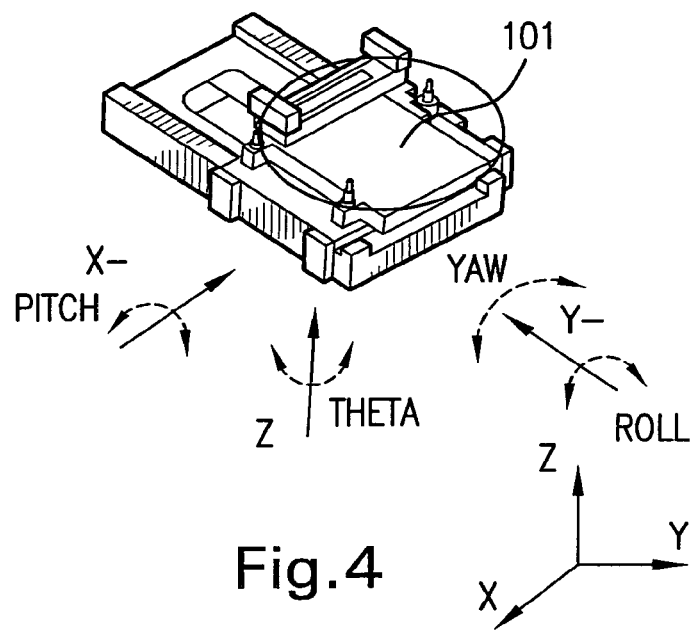
FIG. 4 shows a perspective view of a vacuum chuck assembly for holding a workpiece during an interaction with a line beam.
Figure 5A:
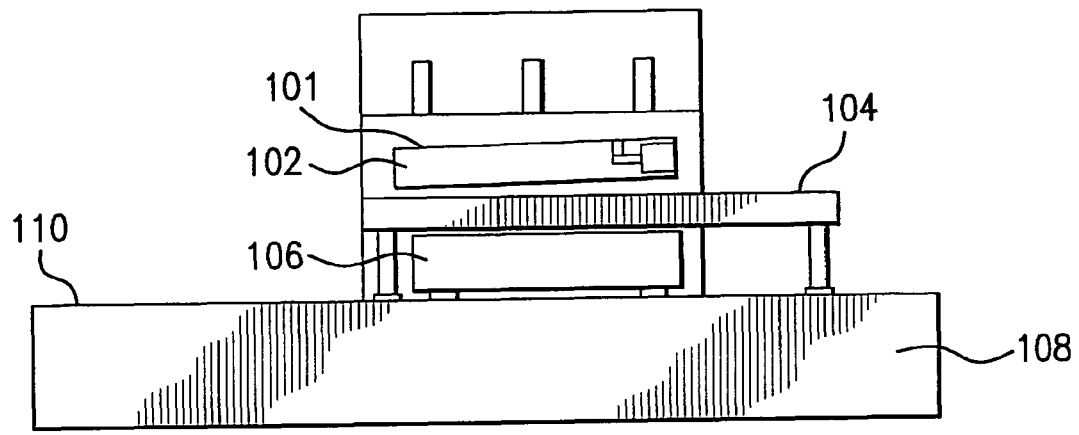
FIGS. 5A-5Q are schematic plan views showing a system, and illustrating its use, for positioning a silicon film for interaction with a line beam.
Figure 5B:
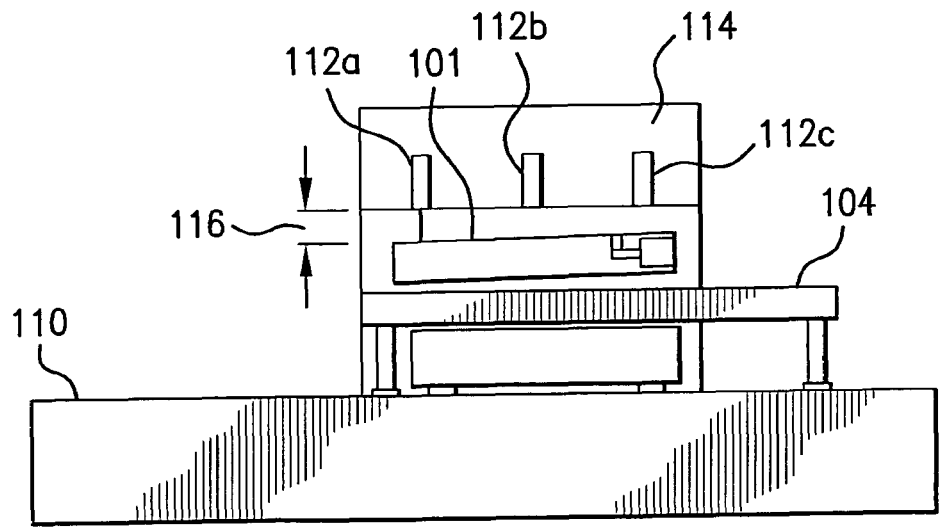
Figure 5C:
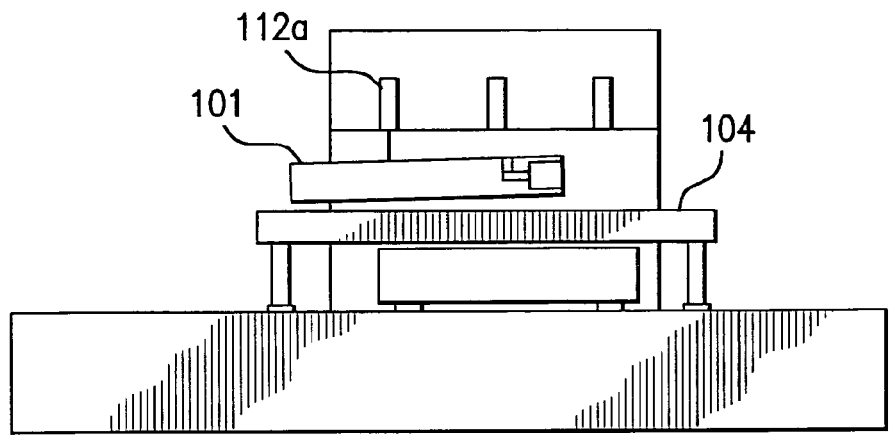
Figure 5D:
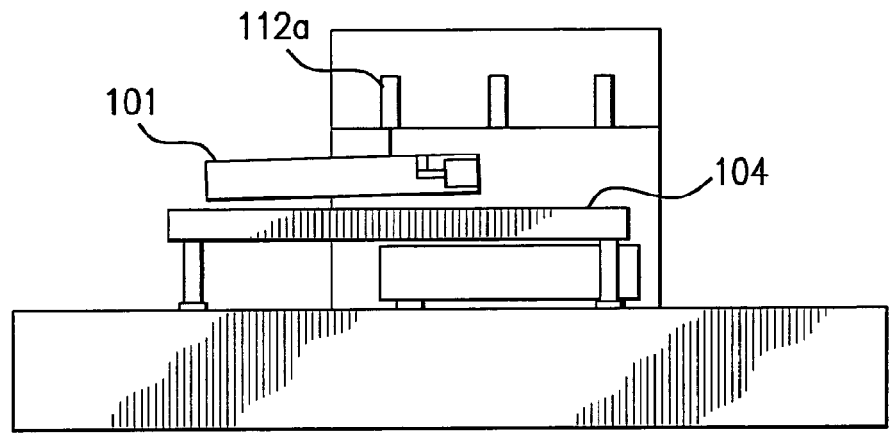
Figure 5E:
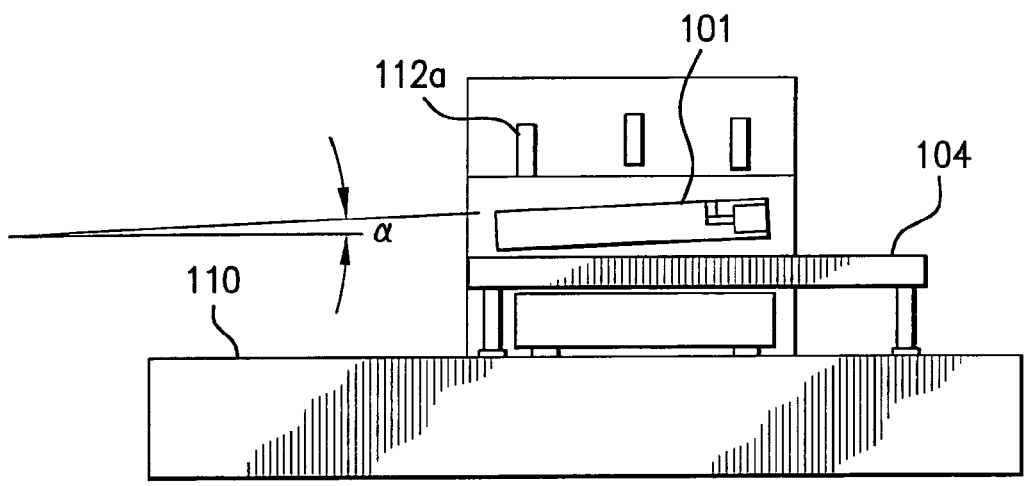
Figure 5F:
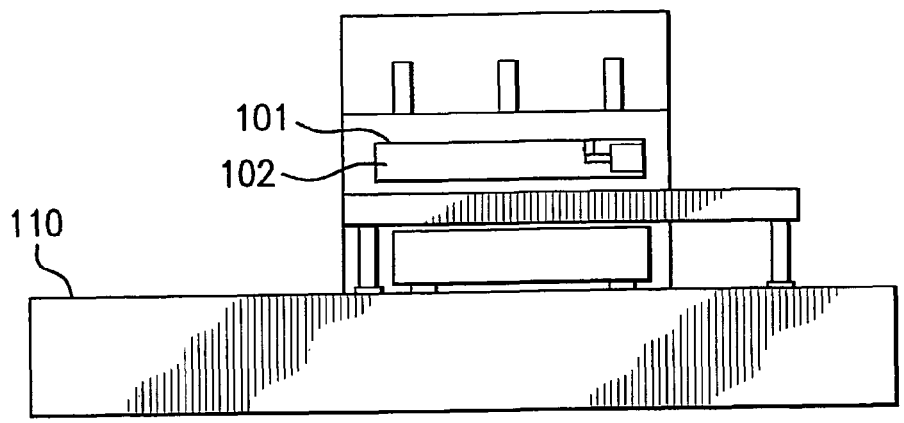
Figure 5G:
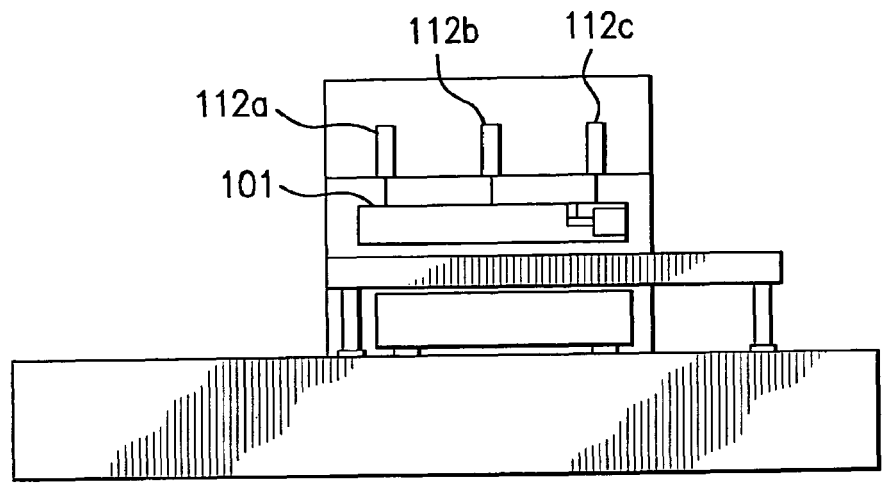
Figure 5H:
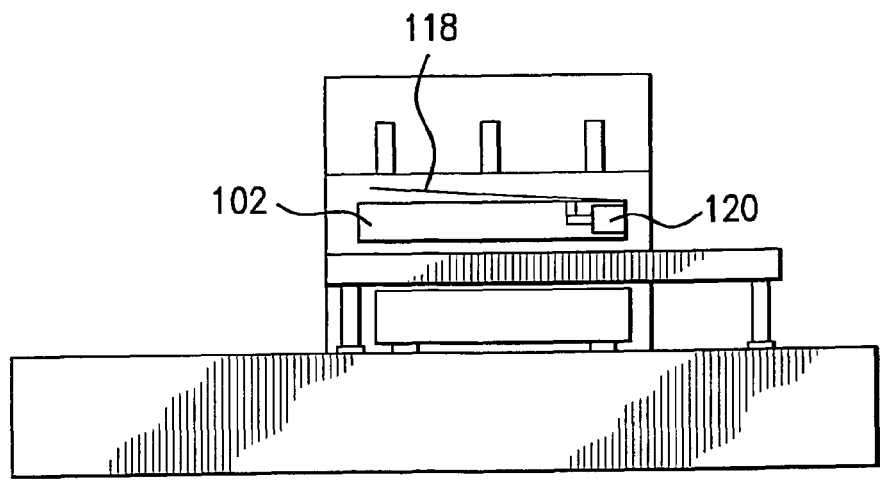
Figure 5I:
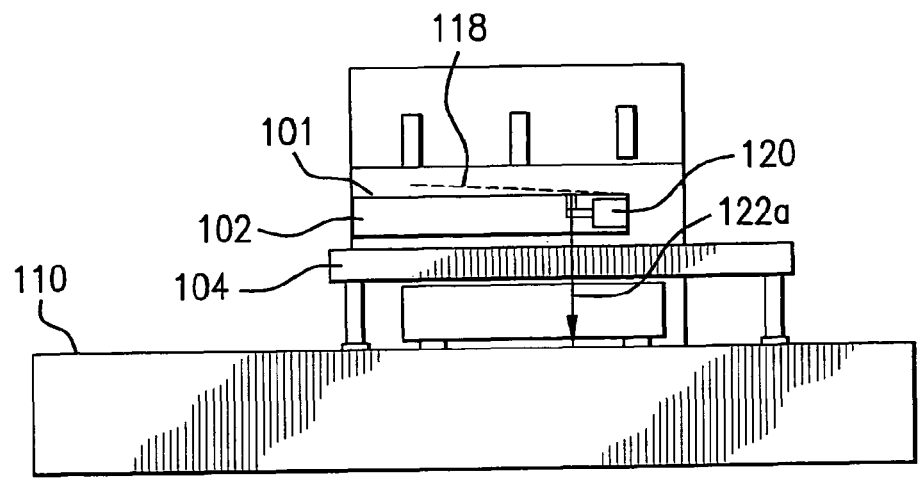
Figure 5J:
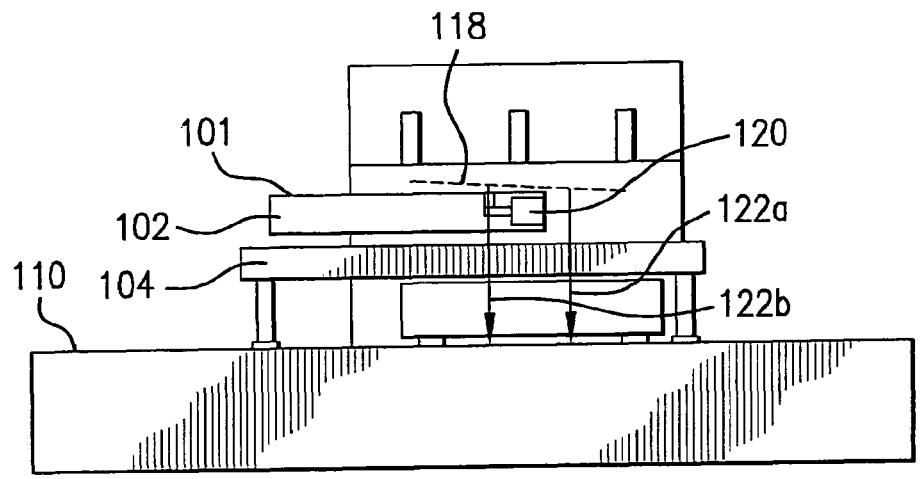
Figure 5K:
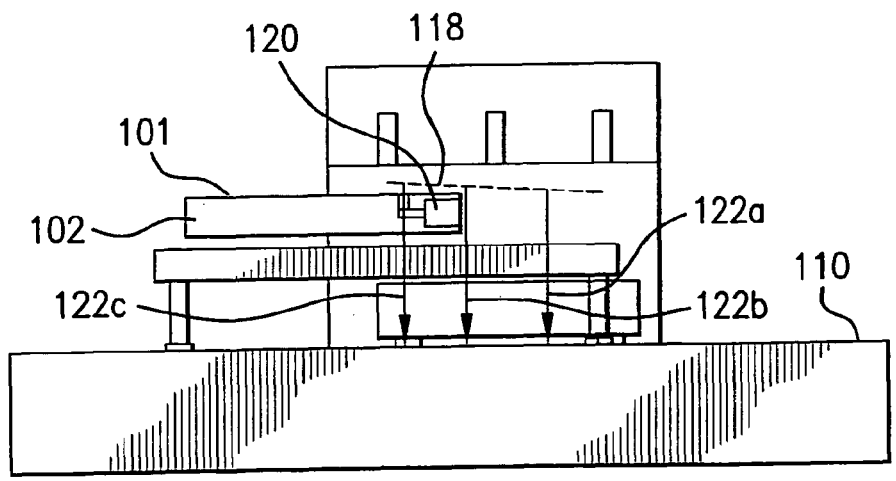
Figure 5L:
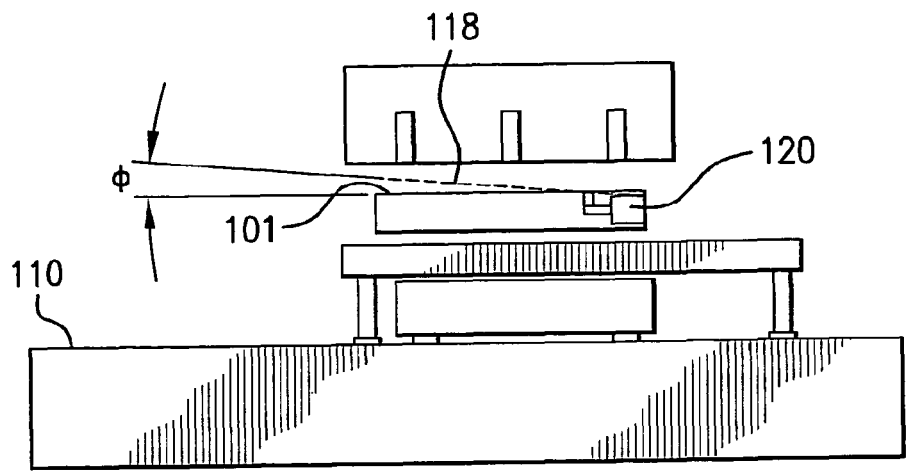
Figure 5M:
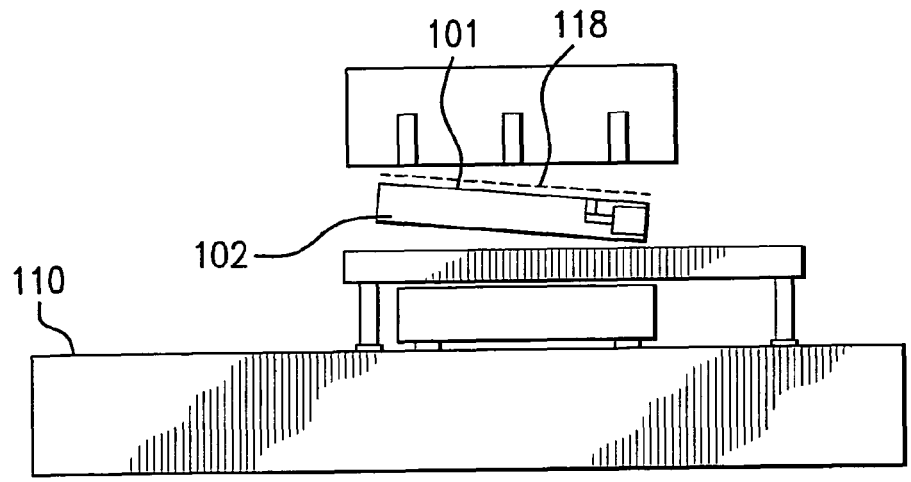
Figure 5N:
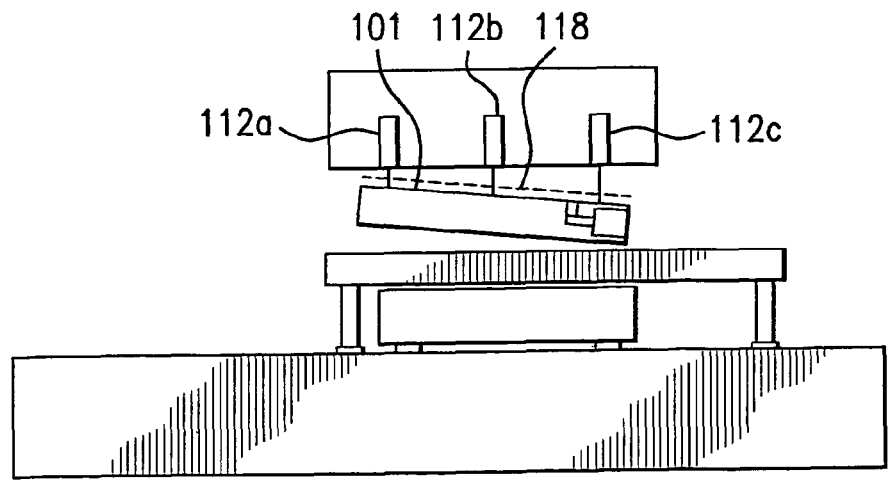
Figure 5O:
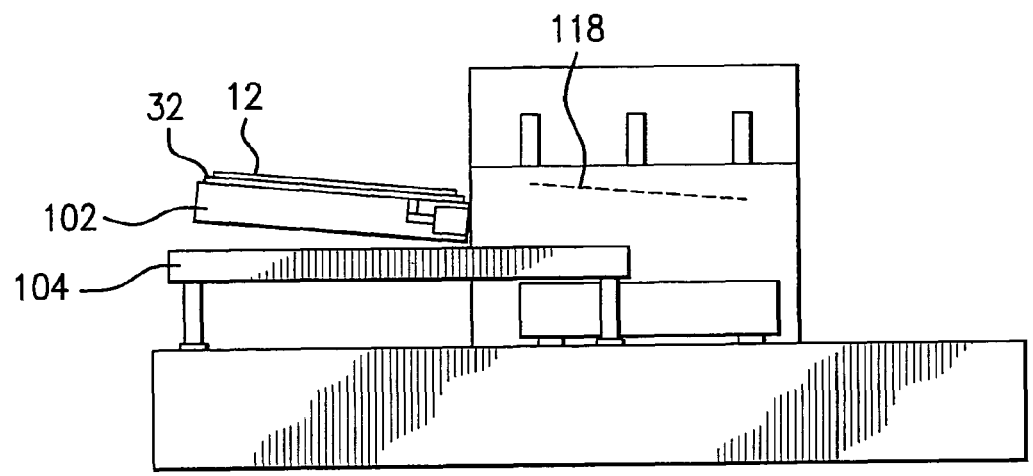
Figure 5P:
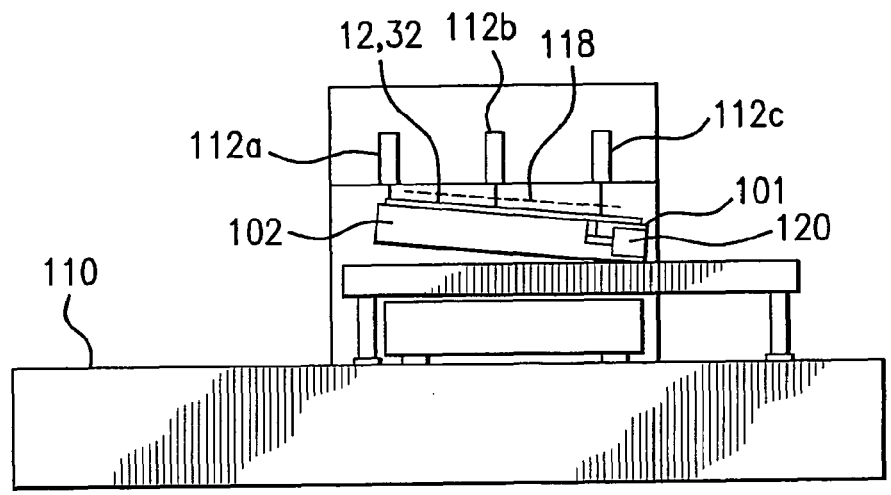
Figure 5Q:
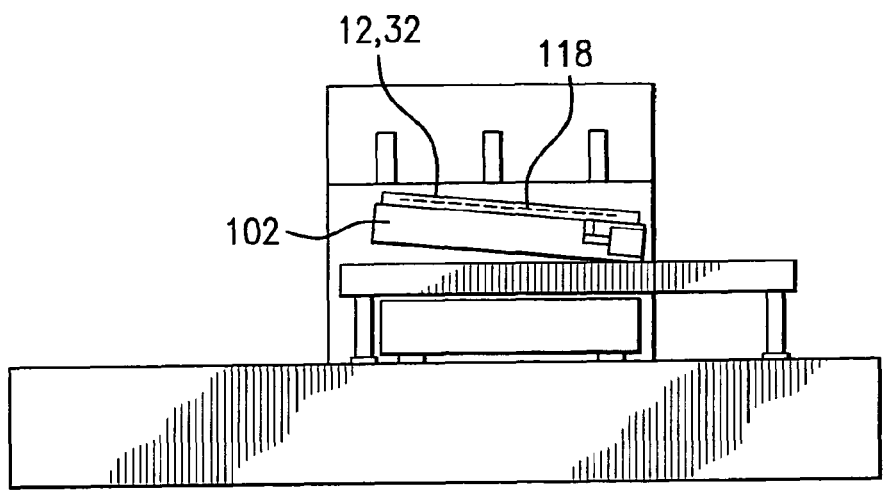

FIGS. 4 and 5A-Q illustrate a system and corresponding method of use to position a film 12 for interaction with a line beam focused from a laser source. As shown in FIG. 4, an exemplary positioning arrangement can include a vacuum chuck 100 having a substantially planar surface 101 (also shown in FIG. 5A), e.g. planar within manufacturing tolerances for the pertinent art, that is positioned on, or is formed as an integral part of, a so-called ZPR table 102 (see FIG. 5A), which may comprise a moveable wedge assembly. As best seen with cross-reference to FIGS. 4 and 5A, the ZPR table 102 can be functionally capable of independently moving the vacuum chuck 100, back and forth in a Z direction, a Pitch direction wherein the chuck 100 is rotated about an X-axis, and a Roll direction in which the chuck 100 is rotated about a Y-axis. FIG. 5A also shows, albeit schematically, that the system may include an X-stage 104 for moving the vacuum chuck 100 back and forth in an X direction and a Y-stage 106 for moving the vacuum chuck 100 back and forth in a Y direction. In a typical exemplary setup, X, Y and Z are three mutually orthogonal axes. As shown, both stages 104, 106 can be moveable relative to a stable reference block 108, e.g. granite block, which defines a substantially planar reference surface 110 (e.g. planar within manufacturing tolerances for the pertinent art). Typically, air bearings may be employed between the stages 104, 106 and granite block 108.

As best seen in FIG. 5B, the system may include a plurality of optical sensors, which for the embodiment shown are three autofocus sensors 112a-c, e.g., active or passive autofocus sensors that are fixedly mounted relative to the granite block 108 via overhead housing 114. As shown, the three autofocus sensors 112A-C are spaced apart along the X-axis. Typically, they can be positioned along a line parallel to or on the X-axis. Moreover, as shown, each autofocus sensor 112a-c is oriented to measure a distance, such as distance 116, parallel to the Y-axis, between the respective autofocus sensors 112a-c and the surface 101. This, in turn, provides a distance, parallel to the Y-axis, between the surface 101 and the reference plane 110. Although three optical sensors are shown, it is to be appreciated that a system having more than three and as few as one optical sensor may be employed to perform some or all of the functional aspects detailed below.

FIGS. 5B-5E illustrate how the system can determine a roll angle, a, between the surface 101 and the reference plane 110. Specifically, beginning with FIG. 5B, it can be seen that a first measurement (distance 116) can be made between the autofocus sensor 112A and the surface 101 with the table 102 at a first position along the X-axis. Next, as shown in FIG. 5C, the table 102 can be translated along the X-axis by activation of the X-stage to position the table at a second position along the X-axis. At this second position, a second distance measurement can be made between the autofocus sensor 112A and the surface 101. Although two measurements are sufficient, FIG. 5D shows that the system may perform a third measurement, with the table at a third position along the X-axis. These measurements can then be processed in an algorithm to determine a roll angle, a, between the surface 101 and the reference plane 110, as shown in FIG. 5E. Note a similar procedure (not illustrated) can be performed by moving the table 102 along the Y-axis to determine an incline angle of the surface 101 relative to the reference plane.

Once the roll angle, a, (and, if desired, an incline angle) have been determined, the ZPR table 102 can be selectively activated to move the surface 101 until it is substantially parallel to the reference plane 110, as shown in FIG. 5F. At this point, a stage coordinate system may be established. In addition, as shown in FIG. 5G, the three autofocus sensors 112a-c may be calibrated for distance to the surface 101 and linearity over the measuring range. With this calibration, the surface 101 can be used as a reference (e.g., an autofocus reference plane) for future measurement.

In one implementation of the system, the spatial position and orientation of a focused line beam of a laser can be determined. An exemplary focused beam which can be characterized by a substantially linear beam axis 118, is depicted as a dashed line in FIG. 5H. For the system shown, pulsed laser light arrives at the beam axis 118 from above and in front of the overhang housing 114. Moreover, a portion of the ZPR table 102 extends outwardly along the Y-axis from the overhang housing 114, such that at least a portion of the surface 101 of the table 102 may be exposed to the pulsed laser.

As further shown in FIG. 5H, the system may comprise a detector, which for the embodiment shown can be a line beam camera 120, for measuring positions for a plurality of the thin beam focal locations (e.g., locations of best focus). More particularly, as shown, the line beam camera 120 can be mounted on the ZPR table 102, and accordingly, may be moveable therewith. It is to be appreciated that an arrangement having a plurality of line beam cameras (not shown) may be used to measure a plurality of line beam focal locations without movement of the X-stage.

FIGS. 5I-5L illustrate how the system with one camera 120 can determine the spatial position of the beam axis 118 and a relative angle, φ, between the surface 101 and the beam axis 118. Specifically, beginning with FIG. 5I, it can be seen that a first measurement can be made by the camera 120 representing (distance 122a), parallel to the Y-axis, between the beam axis 118 and the reference plane 110, with the table 102 at a first position along the X-axis. Next, as shown in FIG. 5J, the table 102 can be translated along the X-axis by activation of the X-stage 104 to position the table at a second position along the X-axis. At this second position, a second distance measurement 122a, parallel to the Y-axis, may be made by the camera 120. Although two measurements may be sufficient in some cases, FIG. 5K shows that the system may, e.g., perform a third measurement (distance 122c), with the table 102 at a third position along the X-axis. These measurements can then be processed in an algorithm to determine a relative angle, φ, between the surface 101 and the beam axis 118, as shown in FIG. 5L.

Once the relative angle, φ, between the surface 101 and the beam axis 118 has been determined, the ZPR table 102 can be selectively activated to move and orient the table 102 into an alignment wherein the surface 101 is substantially parallel (e.g. parallel within acceptable tolerances for the pertinent art) to the beam axis 118, as shown in FIG. 5M. Once aligned, FIG. 5N shows that the autofocus sensors 112a-c may be used to measure the position of surface 101 (i.e., the autofocus reference plane) and calibrate the autofocus sensors 112a-c on the autofocus reference plane. This then establishes a Laser/Stage coordinate system.

FIG. 5O shows that the glass substrate 32 and deposited film 12 may now be positioned on the vacuum chuck (i.e., surface 101). As shown there, the X-stage 104 can be activated to move the table 102 to a favorable position to facilitate positioning of the film 12 on the surface 101. With the film positioned on the table 102, the table 102 can be moved for interaction with the autofocus sensors 112a-c as shown in FIG. 5P. There, the autofocus sensors 112a-c may be used to determine the height of the film 12. With the height of the film 12 known, the ZPR table 102 can be activated to move the film 12 to within the depth of focus (DOF) of the focused, line beam as shown in FIG. 5Q. With the film 12 within the DOF of the laser, the laser can be activated to expose and melt a strip of the film 12, for example, as part of a thin beam, sequential lateral solidification (tb-SLS) process described above.

In another aspect of an embodiment of the present invention, the system shown in FIGS. 5A-5Q may be used to compensate for a film 12 having an imperfect, non-planar surface. This variation in surface profile may result from dimensional imperfections in the film 12, the glass substrate 32 and/or the vacuum chuck surface 101. By compensating for the variations in surface profile, a substantially constant energy density can be maintained at different locations of the film 12. For this purpose, as shown in FIG. 5P, the method can include the first step of using the three autofocus sensors 112a-c to determine three respective distances, parallel to the Y axis, between the sensors and the film 12. Using the line beam camera 120, the ZPR table 102 may be manually adjusted (by varying Z, pitch and roll) to position the surface 101 along a line of best focus (i.e., beam axis 118). Next, the respective distances between each sensor 112a-c and the film 12 can be stored as reference distances, resulting in three coordinate points on the film 12. A linear fit through these three coordinate points can be used to determine a calculated line of best focus (axis 118). During exposure, as the film 12 is scanned along the Y-axis, distances to the film 12 can be measured by e.g., the three autofocus sensors 112a-c, resulting in three new coordinate points. A best-fit line can then be calculated that passes through these new coordinate points and the ZPR table 102 can be adjusted via computer control to align the table 102 such that the best-fit line is substantially co-incident (e.g., coincident within acceptable tolerances for the pertinent art) to the calculated line of best focus (axis 118).

Figure 6:
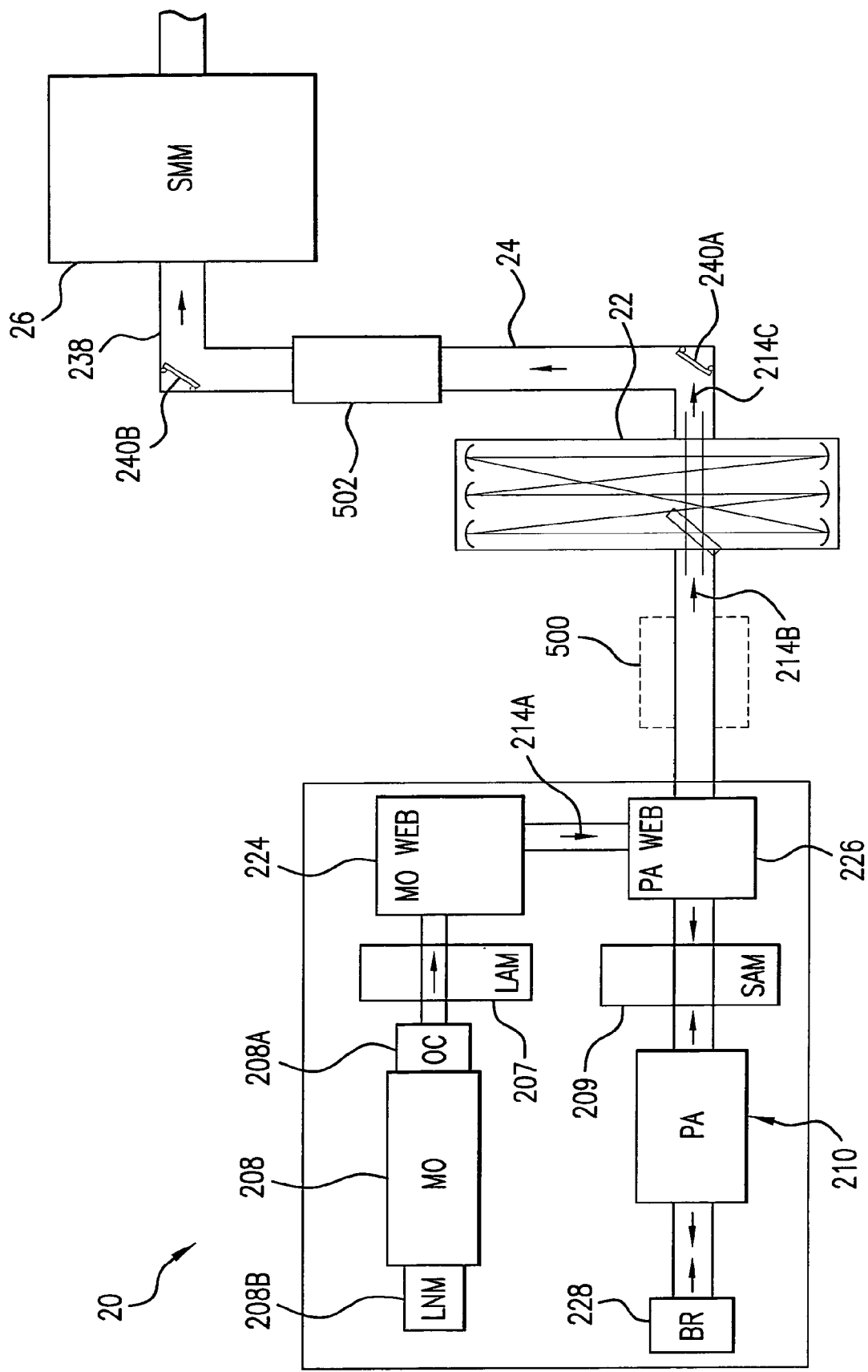
FIG. 6 shows a schematic view of a portion of the system shown in FIG. 1 illustrating an aspect of an embodiment of the present invention.

FIG. 6 shows in further detail a portion of the system 10 shown in FIG. 1. Specifically, FIG. 6 shows an exemplary embodiment having a two chamber, excimer laser 20. It is to be appreciated that other types of laser sources could be used in the system 10, to include solid state lasers, excimer lasers having one chamber, excimer lasers having more than two chambers, e.g., an oscillator chamber and two amplifying chambers (with the amplifying chambers in parallel or in series), or a solid state laser that seeds one or more excimer amplifying chambers. Other designs are possible. Further details for a two chamber laser source 20 shown in FIG. 6, can be found in U.S. application Ser. No. 10/631,349, entitled CONTROL SYSTEM FOR A TWO CHAMBER GAS DISCHARGE LASER, filed on Jul. 30, 2003, U.S. Ser. No. 10/356,168, entitled AUTOMATIC GAS CONTROL SYSTEM FOR A GAS DISCHARGE LASER, filed on Jan. 31, 2003, U.S. Ser. No. 10/740,659, entitled METHOD AND APPARATUS FOR CONTROLLING THE OUTPUT OF A GAS DISCHARGE MOPA LASER SYSTEM, filed on Dec. 18, 2003, U.S. Ser. No. 10/676,907, entitled GAS DISCHARGE MOPA LASER SPECTRAL ANALYSIS MODULE filed on Sep. 30, 2003, U.S. Ser. No. 10/676,224, entitled OPTICAL MOUNTINGS FOR GAS DISCHARGE MOPA LASER SPECTRAL ANALYSIS MODULE, filed Sep. 30, 2003, U.S. Ser. No. 10/676,175, entitled GAS DISCHARGE MOPA LASER SPECTRAL ANALYSIS MODULE, filed Sep. 30, 2003, U.S. Ser. No. 10/631,349, entitled CONTROL SYSTEM FOR A TWO CHAMBER GAS DISCHARGE LASER, filed Jul. 30, 2003, U.S. Ser. No. 10/627,215, entitled VERY NARROW BAND, TWO CHAMBER, HIGH REP-RATE GAS DISCHARGE LASER, filed on Jul. 24, 2003, U.S. Ser. No. 10/607,407, entitled METHOD AND APPARATUS FOR COOLING MAGNETIC CIRCUIT ELEMENTS, filed on Jun. 25, 2003, U.S. Ser. No. 10/922,692, entitled TIMING CONTROL FOR TWO-CHAMBER GAS DISCHARGE LASER SYSTEM, filed on Aug. 20, 2004, U.S. Pat. No. 6,625,191, entitled HIGH REP RATE MOPA LASER SYSTEM, and U.S. Pat. No. 6,567,450, entitled BASIC MODULAR MOPA LASER SYSTEM, the disclosures of all of which are hereby incorporated by reference herein.

In overview, FIG. 6 shows that the two chamber laser source 20 may include a master oscillator 208 and a power amplifier 210, and accordingly, is often referred to as a so-called MOPA laser source. In one implementation of the tb-SLS process described above, a 6 Khz (6000 pulses per second) MOPA laser may be used with pulse energies of approximately 150 mJ. With this arrangement, a 730 mm×920 mm film may be processed (with 60 percent overlap) in about 75 seconds.

The master oscillator 208 and the power amplifier 210 each comprise a discharge chamber which may contain two elongated electrodes, a laser gas, e.g., XeCl, XeF, ArF or KF, a tangential fan for circulating the gas between the electrodes and one or more water-cooled finned heat exchangers (not shown). The master oscillator 208 produces a first laser beam 214A which can be amplified by, e.g., two passes through the power amplifier 210 to produce laser beam 214B. The master oscillator 208 can comprise a resonant cavity formed by output coupler 208A and line narrowing module 208B both of which are described in detail in the applications and patents referenced earlier. The gain medium for master oscillator 208 may be produced between two electrodes, each about thirty to fifty centimeters in length and contained within the master oscillator discharge chamber.

Power amplifier 210 may comprise a discharge chamber similar to the discharge chamber of the master oscillator 208 providing a gain medium between two elongated electrodes. However, unlike the master oscillator 208, the power amplifier 210 typically has no resonant cavity and the gas pressure can, in general, be maintained higher than that of the master oscillator 208. The MOPA configuration shown in FIG. 6 permits the master oscillator 208 to be designed and operated to maximize beam quality parameters such as wavelength stability, and to provide a very narrow bandwidth; whereas the power amplifier 210 may be designed and operated to maximize power output.

The output beam 214A of the master oscillator 8 can be amplified by, e.g., two passes through power amplifier 210 to produce output beam 214B. The optical components to accomplish this can be contained in three modules which Applicants have named: master oscillator wave front engineering box, MO WEB, 224, power amplifier wavefront engineering box, PA WEB, 226 and beam reverser, BR, 228. These three modules along with line narrowing module 208B and output coupler 208A may all be mounted on a single vertical optical table independent of discharge chamber 208C and the discharge chamber of power amplifier 210. With this arrangement, chamber vibrations caused by acoustic shock and fan rotation may be substantially isolated from the optical components.

The optical components in the line narrowing module 208B and output coupler 208A are described in greater detail in the applications and patents referenced above. In overview, the line narrowing module (LNM) 208B may comprise a three or four prism beam expander, a very fast response tuning mirror and a grating disposed in Litrow configuration. The output coupler 208A may be a partially reflecting mirror which typically reflects about 20 percent of the output beam for KrF systems and about 30 percent for ArF systems. The remaining non-reflected light passes through output coupler 208 and into a line center analysis module (LAM) 207. From the LAM 207, light may pass into the MO WEB 24. The MO WEB may comprise a total internal reflection (TIR) prism (or first surface mirror with a high reflection coating) and alignment components for precisely directing the output beam 214A into the PA WEB 226.

The PA WEB 226 may comprise a TIR prism (or first surface mirror with a high reflection coating) and alignment components for directing a laser beam 214A into a first pass through power amplifier gain medium. The beam reverser module 228 may comprise a two-reflection beam reversing prism which relies on total internal reflection and therefore requires no optical coatings. Alternatively, the beam reverser 228 may be a full reflection mirror. In either case, the beam reverser 228 may be adjustable in response to a control signal from a metrology device, e.g., SMM 26, to direct the partially amplified beam on a pre-selected beam path back through the power amplifier gain medium. In particular, the beam reverser may be adjusted to correct beam pointing error and, as discussed below, to reduce the beam divergence of the beam exiting the pulse stretcher 22.

After reversal in the beam reversing module 228, the partially amplified beam 214A can make another pass through the gain medium in power amplifier 210 and exit through spectral analysis module 209 and PA WEB 226 as power amplifier output beam 214B. From the PA WEB 226, the beam enters, e.g., a six-mirror pulse stretcher 22 which, as detailed below, may increase pulse duration, reduce beam intensity variations across the beam section (i.e., average or smooth out the intensity profile), and reduce beam coherence. By increasing pulse duration, the peak intensity of each laser pulse is reduced while maintaining pulse energy. For the system 10 shown in FIG. 1, the optical components in the optics module 28 may comprise relatively large lenses, which are difficult and expensive to fabricate. These expensive optical components are often subject to degradation resulting from billions of high intensity ultraviolet pulses. Moreover, optical damage is known to increase with increasing intensity (i.e., light power (energy/time) per $cm^2$ or $mJ/ns\text{-}cm^2$) of the laser pulses. Thus, reducing pulse intensity by increasing pulse duration may increase the life of these optical components. Moreover, an increase in pulse duration may be beneficial in the crystallization process. Instead of, or in addition to the six mirror pulse stretcher 22, one or more of the pulse stretchers disclosed in co-pending U.S. application Ser. No. 10/712,545, filed on Nov. 13, 2003 and titled, "LONG DELAY AND HIGH TIS PULSE STRETCHER" may be used to create stretched pulses for use in the thin beam sequential lateral solidification (tb-SLS) process described herein, and in particular, pulse stretchers having an output pulse of 200 ns time integrated square (TIS) may be used. U.S. application Ser. No. 10/712,545 is hereby incorporated by reference herein.

Figure 7:
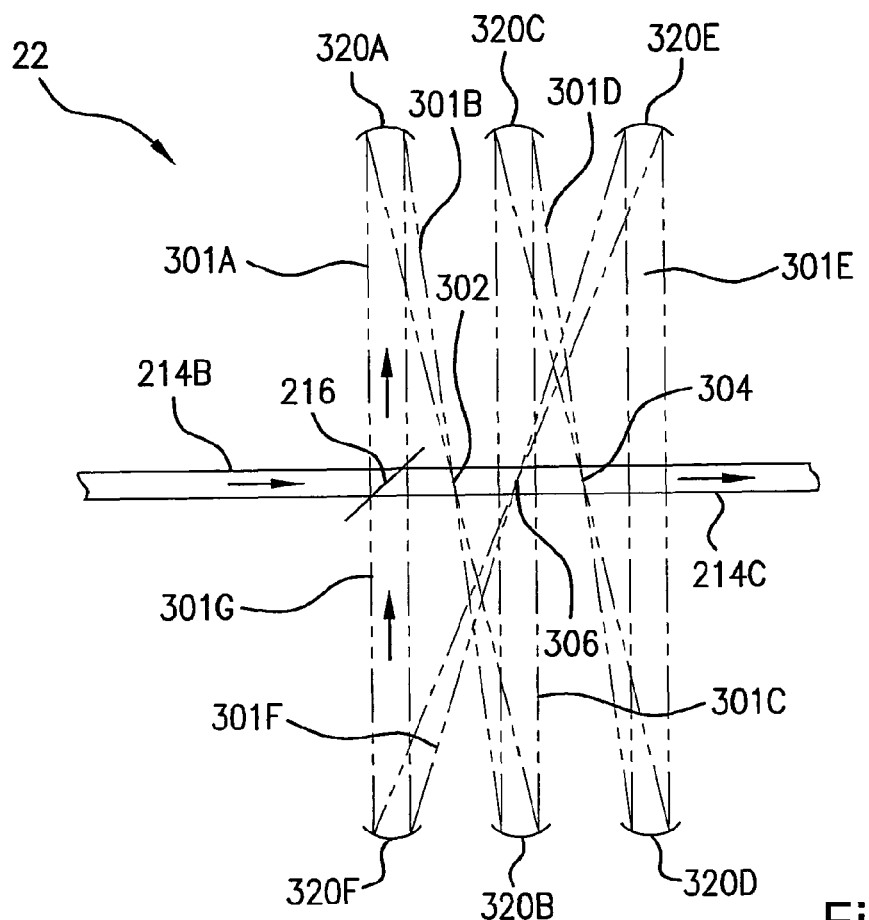
FIG. 7 shows a detailed view of a six-mirror pulse stretcher.

FIG. 7 shows a more detailed view of the six-mirror pulse stretcher 22 showing the beam paths through pulse stretcher 22. A beam splitter 216 can be selected to reflect a predetermined percent of the power amplifier output beam 214B into a delay path created by six focusing mirrors 320A, 320B, 320C, 320D, 320E and 320F. The remaining light is transmitted through the beam splitter 216. It is to be appreciated that the beamsplitter's reflect/pass characteristic may affect the output pulse duration and/or output pulse shape. For the stretcher 22, each mirror 320A-F may be a focusing mirror, e.g., a concave spherical mirror. Typically, to facilitate alignment of the pulse stretcher 22, one or more of the six mirrors may be adjustable, e.g., a tip/tilt adjustment.

Figure 8:
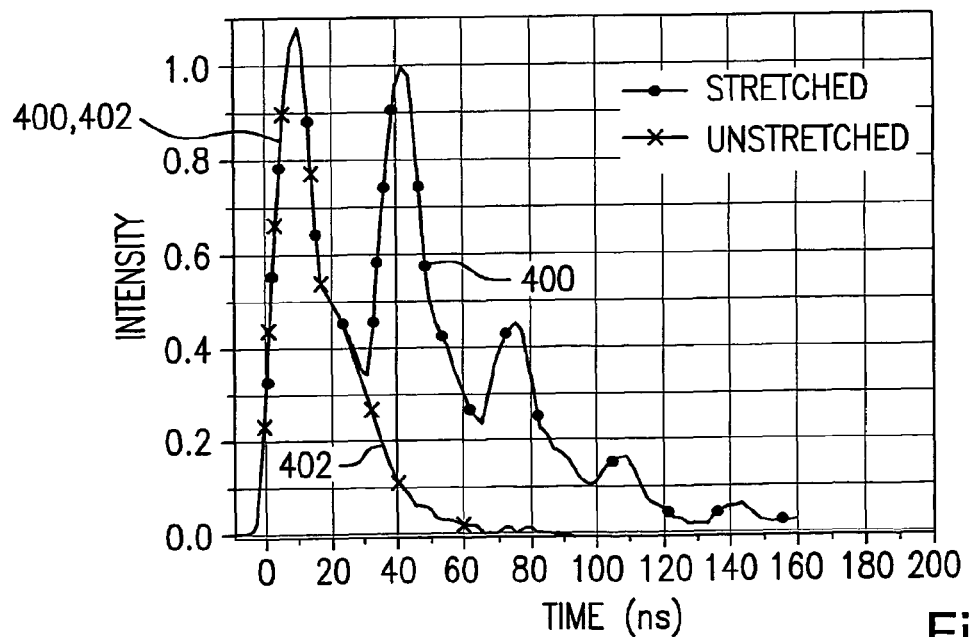
FIG. 8 shows a plot of intensity vs. time for a stretched and an unstretched pulse.

As shown in FIG. 7, reflected light from the beam splitter 216 may travel unfocused (i.e., substantially collimated) along path 301A to mirror 320A which then focuses a reflected portion along path 301B to point 302 which is located midway between mirror 320A and mirror 320B. The beam then expands and may be reflected from mirror 320B, which converts the expanding beam into a parallel (i.e., substantially collimated) beam and directs it along path 301C to mirror 320C. Mirror 320C, can then focus a reflected portion along path 301D to point 304 which may be located midway between mirror 320C and mirror 320D. The beam then expands and can be reflected from mirror 320D which converts the expanding beam into a parallel (i.e., substantially collimated) beam and directs it along path 301E to mirror 320E. Mirror 320E, can then focus a reflected portion along path 301F to point 306 which is located midway between mirror 320E and mirror 320F. The beam may then expand and be reflected from mirror 320F which converts the expanding beam into a parallel (i.e., substantially collimated) beam and directs it along path 301G to beam splitter 216. At the beam splitter 216, the beam from mirror 320F may be reflected onto path 301H where it joins the portion of the pulse that is transmitted through the beam splitter 216. Together, the transmitted and delayed pulse portions establish a pulse stretcher beam output 214C, as shown. The stretched pulse 400 is plotted as intensity vs. time in FIG. 8 and can be compared with the shape of the power amplifier output pulse 402 (unstretched pulse) which is also plotted in FIG. 8. For the stretched pulse shown, the pulse may be shaped having two large, approximately equal peaks with smaller diminishing peaks following in time after the first two peaks. It is to be appreciated that the shape of the stretched pulse can be modified by using a beam splitter having a different reflectivity.

Figure 9:
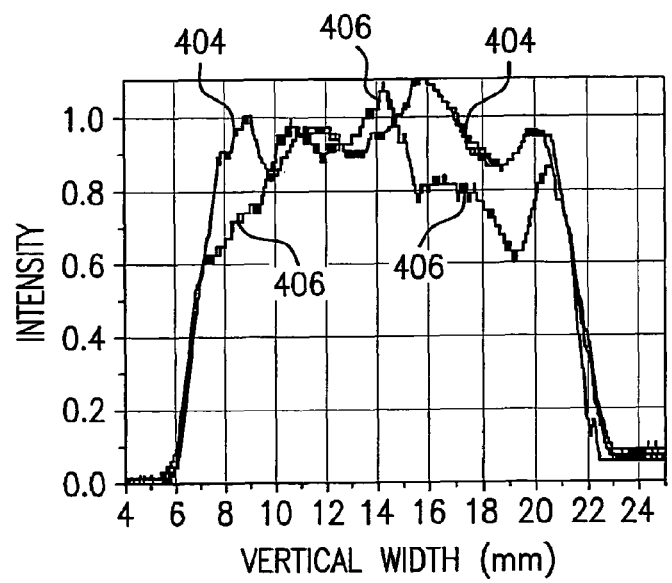
FIG. 9 shows a plot of intensity vs. vertical width illustrating the increase in vertical uniformity of a stretched pulse as compared to an unstretched pulse.

FIG. 7 shows that the delayed beam may be focused and expanded three different times. Because of this odd (i.e., non-even) number of focusing steps, the delayed beam is inverted (both horizontally and vertically) with respect to the portion of the pulse that is transmitted through the beam splitter 216. Hence, the output beam 214C from the six-mirror pulse stretcher 22 may include a combination, or mixed beam. This mixing may reduce intensity variations. The pulse stretcher 22 may also reduce beam coherence, because different coherent cells from different parts of the beam may be mixed. The impact on vertical uniformity of an exemplary beam is depicted in FIG. 9. Specifically, the stretched pulse 404 is plotted as intensity vs. vertical width in FIG. 9 and can be compared with the shape of the power amplifier output pulse 406 (unstretched pulse) which is also plotted in FIG. 9. For the case where the beam is near Gaussian in the horizontal axis, which is often typical when using an excimer laser source, the impact of the pulse stretcher 22 on horizontal intensity variations may be negligible.

As indicated above, the performance of a laser crystallization process may be dependent on energy density uniformity. Unlike lithography which is a multi-shot process and enjoys shot-to-shot averaging during exposure, laser crystallization is, for the most part, a single shot process, and thus, averaging may be limited to intensity averaging within a single pulse. Some of the factors that determine energy density uniformity are laser beam uniformity and beam spatial coherence. Typically, optics may be included in the optics module 28 (FIG. 1) to homogenize the beam. These optics may involve the use of an array of microlenses to divide the beam into beamlets. A large aperture lens may be used to redirect the beamlets so that they precisely overlap each other in the focal plane of the spherical lens. The integration of these beamlets can effectively smooth out any intensity fluctuation, yielding a flat-top beam profile. The more beamlets the beam is divided into, the better the averaging may be. However, if the microlens aperture is too small, e.g., smaller than one coherence area of the laser beam, a coherence area may experience a repetitive pattern of microlenses, which may lead to undesirable results. In short, there may be a limit to the amount of homogenization achieved using an array of microlenses. With this in mind, averaging of the spatial coherence cells in the pulse stretcher 22 may result in a less coherent beam delivered to the microlens array, which in turn, may minimize intensity variations due to interference and/or permit the use of smaller aperture microlens arrays.

One feature of the pulse stretcher 22 shown in FIG. 7 that is worthy of note is that as the beam pointing error of the input beam (i.e., beam 214B) increases, the beam divergence of the output beam (i.e., beam 214C) may increase. This increase in beam divergence is often undesirable for laser crystallization, and accordingly, it is desirable to minimize the beam pointing error of the beam entering the pulse stretcher (i.e., beam 214B). FIG. 6 shows that an active beam steering unit 500 can be positioned upstream of the pulse stretcher 22 to minimize beam pointing error of the beam 214B entering the pulse stretcher. This active beam steering unit may be responsive to a beam pointing measurement made upstream of the pulse stretcher 22 and/or a divergence measurement made downstream of the pulse stretcher 22, for example, a divergence measurement can be made at the SMM 26 and used to control the active beam steering unit 500. Structurally, the active beam steering unit 500 may include one or more adjustable mirrors similar to the mirrors 240A, 240B, discussed in greater detail below and in several applications that have been previously incorporated by reference, to actively control beam steering in the beam delivery unit 238. Alternatively, or in addition to the active beam steering unit 500, the orientation of the beam reverser 228 can be actively adjusted to control beam pointing upstream of the pulse stretcher 22. Specifically, the adjustable beam reverser 228 may be responsive to a beam pointing measurement made upstream of the pulse stretcher 22 and/or a divergence measurement made downstream of the pulse stretcher 22.

FIG. 6 shows that the system 10 may comprise a beam delivery unit 24 and a stabilization metrology module (SMM 26). Functionally, these elements may cooperate with the laser source 20 and pulse stretcher 22 to furnish a pulsed beam at the output of the SMM 26 which meets a set of beam specifications for the application. Indeed, the beam specifications at the input of the optics module 28 (see FIG. 1) may depend on the design of the optics module 28 (i.e., illuminator). Specific beam parameters may include, but are not necessarily limited to, intensity, wavelength, bandwidth, wavefront (e.g., wavefront curvature—also referred to as beam divergence), polarization, intensity profile, beam size, beam pointing, dose stability and wavelength stability. For an optics module capable of producing the line beam described above for laser crystallization, e.g., 20 microns by 700 mm, it may be required to maintain pointing stability to within 20 μrad, wavefront curvature change to less than 10% and energy stability to within +/−2%. Moreover, to avoid wasting shots, it may be desirable to obtain these properties without requiring that the laser operate continuously for a relatively long period until the laser has "stabilized".

Figure 10:
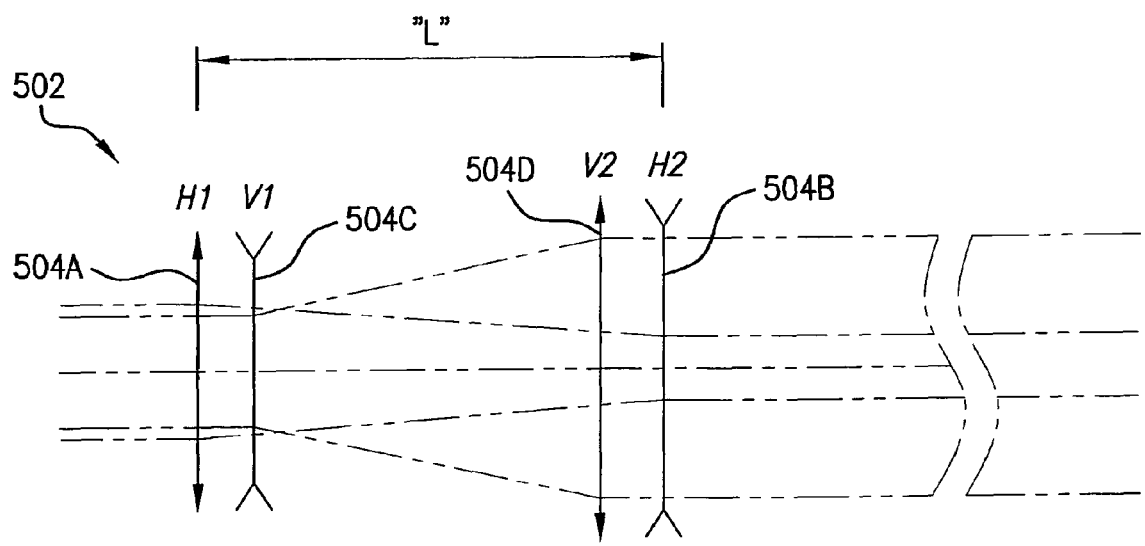
FIG. 10 shows an actively controllable beam expander that is independently adjustable in two axes.

The SMM 26 can be positioned upstream of an input port of the optics module 28 to monitor the incoming beam and providing feedback signals to a control system to assure that the light provided to the optics module 28 at the desired parameters including beam pointing, beam position, beam size, wavefront and pulse energy. For example, pulse energy, beam pointing and beam position may be monitored by meteorology equipment in the SMM 26 on a pulse to pulse basis using techniques described in U.S. patent application Ser. No. 10/425,361 (361 application) that was previously incorporated by reference herein. Specifically, FIG. 10B of the '361 application illustrates a structural arrangement for measuring pulse energy, beam pointing and beam position on a pulse to pulse basis. As detailed further below, the SMM 26 can also be configured to monitor wavefront curvature and beam size. The use of a DSP based processor, combined with high speed CMOS linear photo-diode arrays may permit rapid calculation of beam properties at up to 8 kHz, as well as rapid feedback to stabilize the beam properties.

The vertical and horizontal beam pointing and position errors may be evaluated at the SMM 26 for every pulse of light generated by the laser. In total there are four independent sensor measurements: vertical pointing error, horizontal pointing error, vertical position error, and horizontal position error. In one exemplary implementation, vertical and horizontal pointing may be measured by putting far-field images on linear photodiode array (PDA) elements, such the S903 NMOS Linear Image Sensors offered by Hamamatsu Corporation with offices in Bridgewater, N.J. Typically, pointing errors may be defined from target locations defined at the exit of SMM 26. Vertical and horizontal position may be measured by putting reduced images of the beam near the BDU exit on linear PDA elements. The pulse energy of the beam may be measured at the SMM 26 with a calibrated photo-cell circuit. Signals from the sensors in the SMM 26 may be sent through electrical connectors to a Stabilization Controller which may form a part of the SMM 26.

Beam pointing control may be achieved by selectively adjusting the orientation of the beam reverser 228 (as discussed earlier), using an active beam steering module 500 upstream of the pulse stretcher 22 (also discussed earlier) and/or within the BDU 24. Specifically, the BDU 24 may comprises two beam-pointing mirrors 240A and 240B, one or both of which may be controlled to provide tip and tilt correction to vary beam pointing. Beam pointing may be monitored in the SMM 26 providing feedback control to one or both of the pointing mirrors 240A, 240B. For example, the error signals may be sent to the Stabilization Controller in the SMM 26 that processes the raw sensor data and generates commands to drive fast steering turning mirrors 40A and 40B. These two fast steering turning mirrors, each with 2 axes of control, may be placed upstream of the SMM 26, as shown. The turning mirrors can each be mounted to a fast steering motor. In particular embodiments, piezoelectric mirror drivers may be provided to permit rapid (200 Hz) beam pointing and position correction.

The motor actuates the mirror angle in two axes and thus may redirect the path of the laser beam. Two motors with 2 axes of control can enable the BDU stabilization controller to independently regulate the vertical and horizontal beam pointing and position errors. The control system can correct for the beam errors from pulse-to-pulse. Namely, the beam errors from each laser pulse can be fed to a feedback control system to generate commands for the steering motors. The electronics used to run the feedback control system may be located in the Stabilization Controller. By placing the mirrors as shown in FIG. 6, the drift due to the laser, attenuator (if provided) and other optics may be corrected. Thus, a stable beam (in position and pointing) may be projected at the entrance of the optics module 28 having, in some cases, stability to within 10 μrad.

The pulse energy monitored at the SMM 26 may be used as a feedback signal and input to the laser's energy control algorithm. For a gas discharge laser, the laser's discharge voltage may be adjusted to alter pulse energy. Since the energy control algorithm can stabilize energy at the SMM 26 (which is at the optics module 28 input), any short term or long term drifts in pulse energy due to optical absorption or other causes may be compensated.

As indicated above, the SMM 26 may also measure the beam size and beam divergence (i.e., wavefront curvature). Typically, apertures at the laser exit can be used to fix the beam size from the laser. However, beam divergence from the laser can change due to optics heating, laser energy, laser voltage and F2 concentration in the discharge gas when using a fluoride excimer laser.

As shown in FIGS. 6 and 7, beam divergence and beam size may be actively controlled using an adjustable beam expander 502 that can be positioned along the BDU 24. As shown in FIG. 7, the beam expander 502 may comprise four lenses, two horizontal lenses 504A, 504B and two vertical lenses 504C, 504D. In one setup, the beam expander 502 may have a length, L, of about 0.30 m and be sized having a nominal input of 12 mm in the horizontal axis and 9 mm in the vertical axis, and a nominal output of 5 mm in the horizontal axis and 18 mm in the vertical axis. In an exemplary arrangement, lens 504A may be plano-convex cylindrical with f=507.0 mm, lens 504B may be plano-convex cylindrical with f=202.8 mm, lens 504C may be plano-convex cylindrical with f=202.8 mm, lens 504D may be plano-convex cylindrical with f=405.6 mm. In an alternative arrangement, lenses 504A and 504C may be replaced by a single lens. Changes in beam divergence and beam size may be achieved by adjusting the spacing of beam expander lenses. Specifically, the spacing between lens 504A and 504B may be change to alter the beam in a horizontal axis and the spacing between lens 504C and 504D may be change to alter the beam in a vertical axis. In one embodiment, the moveable lenses can be mounted on a linear motorized drive. The expander 504 can then allow independent control of horizontal and vertical beam wavefront.

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art. While the particular aspects of embodiment(s) of the Systems and Methods for Implementing an Interaction between a Laser Shaped as a Line Beam and a Film Deposited on a Substrate described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present Systems and Methods for Implementing an Interaction between a Laser Shaped as a Line Beam and a Film Deposited on a Substrate is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

We claim:

1. An apparatus for reducing beam divergence, the apparatus comprising:
    a laser source configured to generate a plurality of beam pulses;
    a pulse stretcher configured to lengthen an input beam received from the laser source by reflecting a portion of the input beam through a delay path comprising a plurality of mirrors, the pulse stretcher being further configured to recombine the reflected portion of the input beam with the non-reflected portion of the input beam;
    a stabilization metrology module configured to measure beam divergence of a beam output from the pulse stretcher, wherein the stabilization metrology module is further configured to transmit a control signal to a beam steering unit if the measured beam divergence exceeds a predetermined threshold; and
    the beam steering unit disposed before an input of the pulse stretcher, the beam steering unit comprising an adjustable mirror, wherein the beam steering unit is configured to minimize beam pointing errors of the beam entering the pulse stretcher by adjusting the adjustable mirror in response to receiving a control signal from the stabilization metrology module.

2. The apparatus of claim 1, wherein the laser source comprises a two chamber excimer laser.

3. The apparatus of claim 2, wherein the two chamber excimer laser has a master oscillator, power amplifier (MOPA) configuration.

4. The apparatus of claim 3, wherein the laser source further comprises a beam reverser.

5. The apparatus of claim 4, wherein the beam reverser comprises a two-reflection beam reversing prism.

6. The apparatus of claim 4, wherein the orientation of the beam reverser is actively adjustable in order to correct beam pointing errors.

7. The apparatus of claim 6, wherein the beam reverser is configured to adjust its orientation upon receiving a control signal from the stabilization metrology module.

8. The apparatus of claim 6, wherein the beam reverser is configured to adjust its orientation upon receiving a control signal from the beam steering unit.

9. The apparatus of claim 1 further comprising a beam expander.

10. The apparatus of claim 9, wherein the beam expander comprises two pairs of plano-convex cylindrical lenses.

11. The apparatus of claim 10, wherein the spacing between the each pair of lenses can be adjusted to reduce beam divergence.

12. An apparatus for reducing beam divergence, the apparatus comprising:
    a laser source configured to generate a plurality of beam pulses, wherein the laser source comprises a beam reverser configured to automatically adjust its orientation upon receiving a control signal from a stabilization metrology module;
    a pulse stretcher configured to lengthen an input beam received from the laser source by reflecting a portion of the input beam through a delay path comprising a plurality of mirrors, the pulse stretcher being further configured to recombine the reflected portion of the input beam with the non-reflected portion of the input beam; and a beam steering unit disposed before an input of the pulse stretcher, the beam steering unit configured to minimize beam pointing errors of the beam entering the pulse stretcher, wherein the stabilization metrology module is configured to measure beam divergence of a beam output from the pulse stretcher, and wherein the stabilization metrology module is further configured to transmit a control signal to the beam reverser if the measured beam divergence exceeds a predetermined threshold.

13. The apparatus of claim 12 further comprising a beam expander.

14. The apparatus of claim 12 wherein the beam steering unit comprises an adjustable mirror, and wherein the beam steering unit is configured to adjust said adjustable minor in response to receiving a control signal from the stabilization metrology module.

15. The apparatus of claim 13, wherein the beam expander comprises two pairs of plano-convex cylindrical lenses.

16. The apparatus of claim 14, wherein the spacing between each pair of lenses can be adjusted to reduce beam divergence.

17. An apparatus for reducing beam divergence, the apparatus comprising:

a laser source configured to generate a plurality of beam pulses;

a pulse stretcher configured to lengthen an input beam received from the laser source by reflecting a portion of the input beam through a delay path comprising a plurality of mirrors, the pulse stretcher being further configured to recombine the reflected portion of the input beam with the non-reflected portion of the input beam;

a stabilization metrology module configured to measure beam divergence of a beam output from the pulse stretcher, wherein the stabilization metrology module is further configured to transmit a control signal to a beam expander if the measured beam divergence exceeds a predetermined threshold; and a beam steering unit disposed before an input of the pulse stretcher, the beam steering unit configured to minimize beam pointing errors of the beam entering the pulse stretcher, wherein the beam expander comprises two pairs of lenses, and wherein the beam expander is further configured to adjust the spacing between one or both pairs of lenses in response to a control signal received from the stabilization metrology module.

18. The apparatus of claim 17 wherein the beam steering unit comprising an adjustable mirror, wherein the beam steering unit is configured to adjust said adjustable minor in response to receiving a control signal from the stabilization metrology module.

19. The apparatus of claim 18, wherein the laser source further comprises a beam reverser configured to adjust its orientation upon receiving a control signal from the stabilization metrology module.

20. The apparatus of claim 18, wherein the laser source further comprises a beam reverser configured to adjust its orientation upon receiving a control signal from the beam steering unit.

* * * * *